United States Patent
Kim

(10) Patent No.: US 12,384,330 B2
(45) Date of Patent: Aug. 12, 2025

(54) LAMP SYSTEM FOR VEHICLE

(71) Applicant: HYUNDAI MOBIS CO., LTD., Seoul (KR)

(72) Inventor: Myeong Je Kim, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 18/390,089

(22) Filed: Dec. 20, 2023

(65) Prior Publication Data
US 2024/0391429 A1   Nov. 28, 2024

(30) Foreign Application Priority Data
May 24, 2023   (KR) .................. 10-2023-0066955

(51) Int. Cl.
| | |
|---|---|
| B60S 1/60 | (2006.01) |
| B06B 1/06 | (2006.01) |
| B08B 7/02 | (2006.01) |
| B60Q 1/00 | (2006.01) |
| H05K 7/20 | (2006.01) |

(52) U.S. Cl.
CPC ............ B60S 1/603 (2013.01); B06B 1/0644 (2013.01); B08B 7/028 (2013.01); B60Q 1/0023 (2013.01); H05K 7/20172 (2013.01)

(58) Field of Classification Search
None
See application file for complete search history.

(56) References Cited

U.S. PATENT DOCUMENTS

| | | | |
|---|---|---|---|
| 2020/0018458 A1* | 1/2020 | Nakaya | F21S 45/43 |
| 2022/0271849 A1* | 8/2022 | Verdet | G08C 17/02 |

FOREIGN PATENT DOCUMENTS

| | | | |
|---|---|---|---|
| DE | 102019130264 A1 * | 5/2021 | |
| KR | 20220132034 A | 9/2022 | |

OTHER PUBLICATIONS

Google Patents translation of KR20220132034A (Year: 2025).*
Google Patents translation of DE102019130264A1 (Year: 2025).*

* cited by examiner

*Primary Examiner* — Eric W Golightly
(74) *Attorney, Agent, or Firm* — NovoTechIP International PLLC

(57) ABSTRACT

A lamp system for a vehicle includes a sensor unit including at least one of a camera sensor or a distance detection sensor, the system including: a light source unit including at least one lens and at least one light source; a piezoelectric element positioned on a surface of the lens and generating a vibration based on an electrical acoustic signal; and a control unit controlling the piezoelectric element, wherein the control unit controls the piezoelectric element by varying the electrical acoustic signal based on sensing information received from the sensor unit.

8 Claims, 13 Drawing Sheets

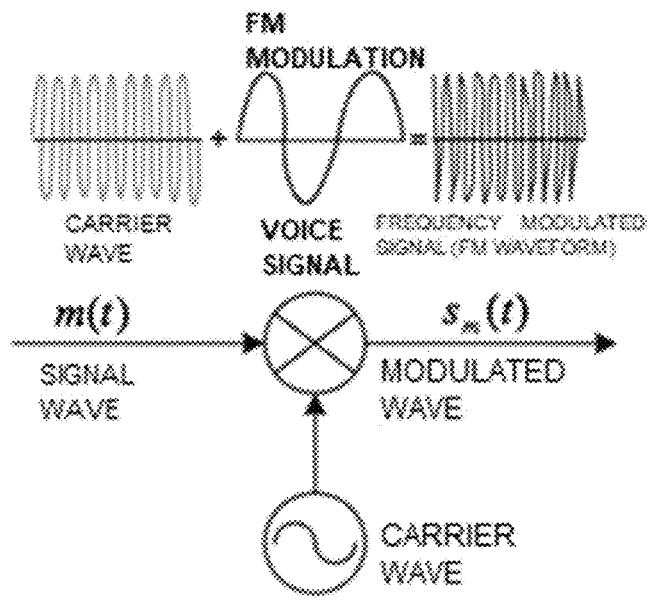
FIG. 13A
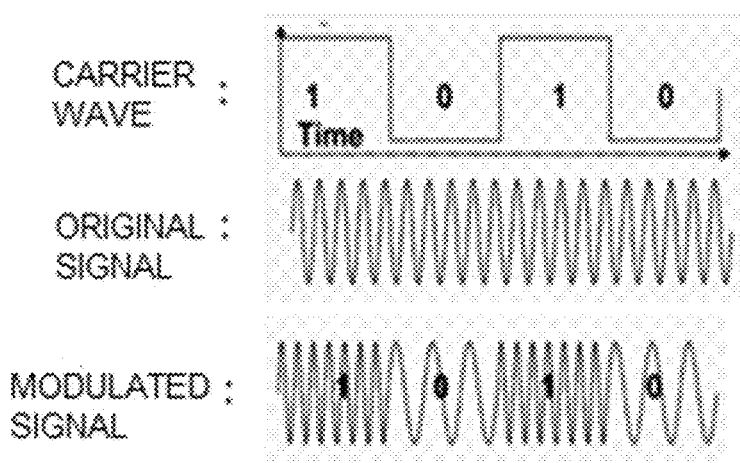
FIG. 13B
FIG. 13C
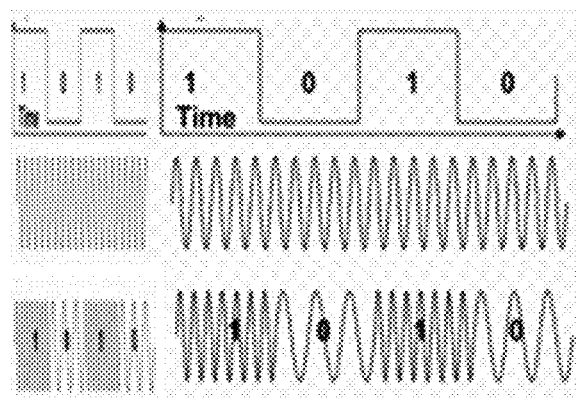

LAMP SYSTEM FOR VEHICLE

CROSS-REFERENCE TO RELATED APPLICATIONS

This application claims priority under 35 U.S.C. § 119 to Korean Patent Application No. 10-2023-0066955, filed on May 24, 2023, in the Korean Intellectual Property Office, the disclosure of which is incorporated herein by reference in its entirety. The application is also related to the subject matter of Korean Patent Laid-Open Publication No. 10-2022-0132034 (entitled "CLEANING DEVICE FOR A HEAD-LIGHT, IN PARTICULAR A VEHICLE HEADLIGHT," and published on Sep. 29, 2022) also incorporated in its entirety.

TECHNICAL FIELD

The following disclosure relates to a lamp system, and more particularly, to a lamp system for a vehicle.

BACKGROUND

A communication lamp system refers to a lamp system operated based on various information rather than simply turning on and off a lamp. In detail, the communication lamp system may display a state of a moving object as a letter or an icon on a road, thus allowing its communication with a pedestrian. In addition, the communication lamp system may allow a lamp to receive information on various situations on the road by being linked with an advanced driver assistance system (ADAS) sensor, and may also prevent glare by providing light to people and simultaneously controlling an amount of light suitable for the various situations based thereon. Accordingly, as shown in FIG. 1, a sensor integrated lamp technology of integrating the ADAS sensor in the lamp system has recently been spotlighted.

Meanwhile, as shown in FIGS. 2A and 2B, it may be seen that the conventional lamp system has a recognition rate of the ADAS sensor that is significantly reduced depending on an external environment (e.g., weather). In detail, it may be seen that referring to FIG. 2A, the conventional lamp system recognizes a person in front of a lens when there is no water condensation on a lens surface, and on the other hand, referring to FIG. 2B, the conventional system fails to recognize a person in front of the lens when there is water condensation on the lens surface. The water condensation is used as an example in FIGS. 2A and 2B. However, in addition thereto, the conventional system may have the recognition rate of the ADAS sensor that is significantly reduced by various foreign materials positioned on the lens surface.

Therefore, there is a need for technology to prevent a situation where the recognition rate of the ADAS sensor is reduced due to the foreign material on the lens. Moreover, it is mandatory for a headlamp exceeding 2,000 lumens to be equipped with a lamp washing function, and accordingly, there is a need for technology in which the recognition rate of the ADAS sensor is improved using a lamp washing system.

SUMMARY

An embodiment of the present disclosure is directed to providing a lamp system for a vehicle that uses vibration to wash a lens of the lamp system for a vehicle.

In one general aspect, provided is lamp system for a vehicle which includes a sensor unit including at least one of a camera sensor or a distance detection sensor, the system including: a light source unit including at least one lens and at least one light source; a piezoelectric element positioned on a surface of the lens and generating a vibration based on an electrical acoustic signal; and a control unit controlling the piezoelectric element, wherein the control unit controls the piezoelectric element by varying the electrical acoustic signal based on sensing information received from the sensor unit.

The lens may include an outer lens positioned in front of the light source, and the piezoelectric element may be attached to a surface of the outer lens that is directed to the light source.

The piezoelectric element may be attached to a bent corner of the surface of the outer lens, and attached to a position where a distance from a center is closer than a distance from each of the two ends based on a horizontal axis of the surface of the outer lens.

The system may further include an amplifier amplifying the electrical acoustic signal received from the control unit and outputting the amplified signal to the piezoelectric element.

The control unit may determine a size of a foreign material based on a distribution area of the foreign material when determining that the foreign material exists on the lens based on the sensing information received from the camera sensor, and vary a frequency of the electrical acoustic signal based on the determined size of the foreign material.

The control unit may determine a size of a foreign material based on a distribution area of the foreign material when determining that the foreign material exists on the lens based on the sensing information received from the distance detection sensor, and vary a frequency of the electrical acoustic signal based on the determined size of the foreign material.

The control unit may vary the frequency of the electrical acoustic signal based on the determined size, output an acoustic signal of a first frequency when determining that the size of the foreign material is larger than a predetermined standard, and output an acoustic signal of a second frequency when determining that the size of the foreign material is smaller than the predetermined standard, and the second frequency may be higher than the first frequency.

The control unit may recognize an object positioned in front of the lamp system for a vehicle based on the sensing information detected through the sensor unit, and output an acoustic signal of a third frequency when recognizing the object, and the third frequency may be higher than the second frequency.

The system may further include a temperature detection sensor measuring a temperature of the piezoelectric element, wherein the control unit varies a frequency of the electrical acoustic signal based on the measured temperature.

The system may further include a heat reduction unit reducing heat occurring in the piezoelectric element.

The heat reduction unit may include a protection cover coupled with the piezoelectric element.

The heat reduction unit may include a fan positioned on each of the two sides or one side of the piezoelectric element.

The control unit may generate the electrical acoustic signal by multiplying a carrier wave by a sound source data signal, fix and modulate a frequency of the carrier wave when the sound source data signal has a fixed frequency, and vary and modulate the frequency of the carrier wave when the sound source data signal has a variable frequency.

BRIEF DESCRIPTION OF THE DRAWINGS

FIGS. 13A, 13B, and 13C are schematic views each showing a method for preventing interference with a surrounding ultrasonic sensor.

DETAILED DESCRIPTION

In order to describe the present disclosure, operational advantages of the present disclosure, and objects accomplished by embodiments of the present disclosure, the embodiments of the present disclosure are hereinafter exemplified and described with reference to the accompanying drawings.

First, terms used in this application are used only to describe specific embodiments rather than limiting the present disclosure, and a term of a singular number may include its plural number unless explicitly indicated otherwise in the context. In addition, it is to be understood that a term "include," "have", or the like used in this application specifies the existence of features, numerals, steps, operations, components, parts, or combinations thereof, which are mentioned in the specification, and does not preclude the existence or addition of one or more other features, numerals, steps, operations, components, parts, or combinations thereof.

When it is decided that the detailed description of the known configuration or function related to the present disclosure may obscure the gist of the present disclosure, the detailed description thereof will be omitted.

Figure 1:
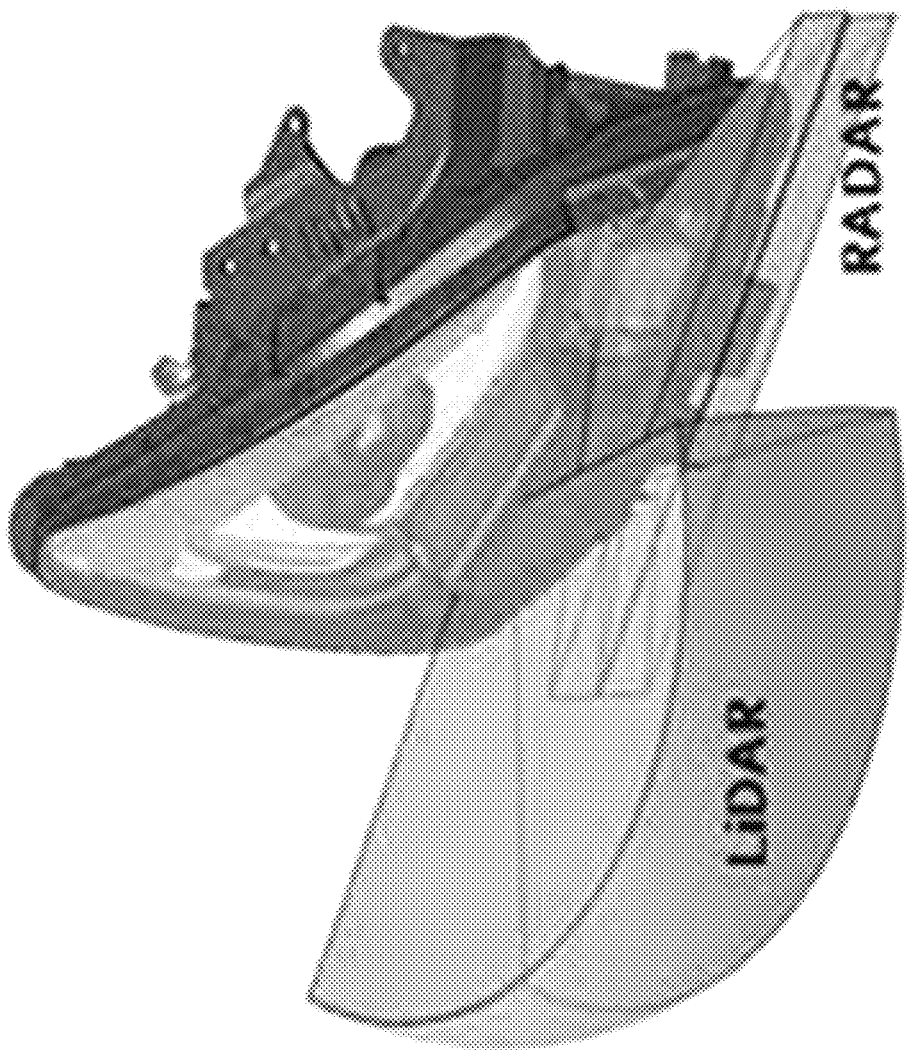
FIG. 1 is a view showing a conventional headlamp.
Figure 2A:
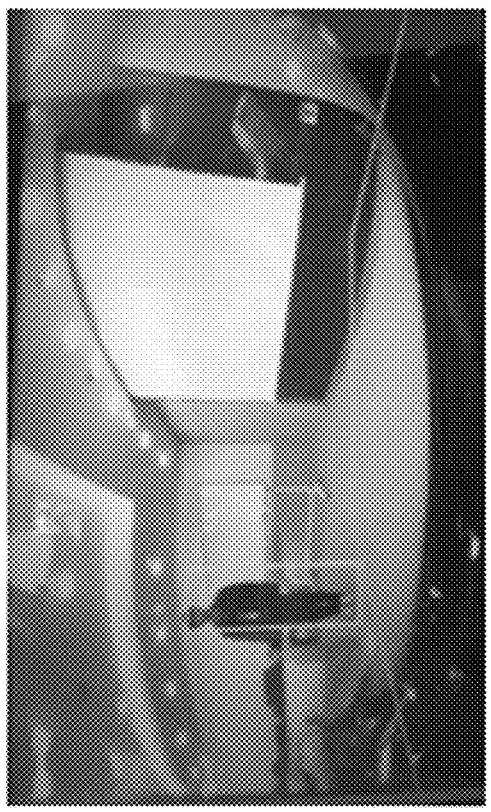
FIGS. 2A and 2B are views each showing a change in recognition of an advanced driver assistance system (ADAS) that occurs due to water condensation on a lens surface.
Figure 2B:
Figure 3B:
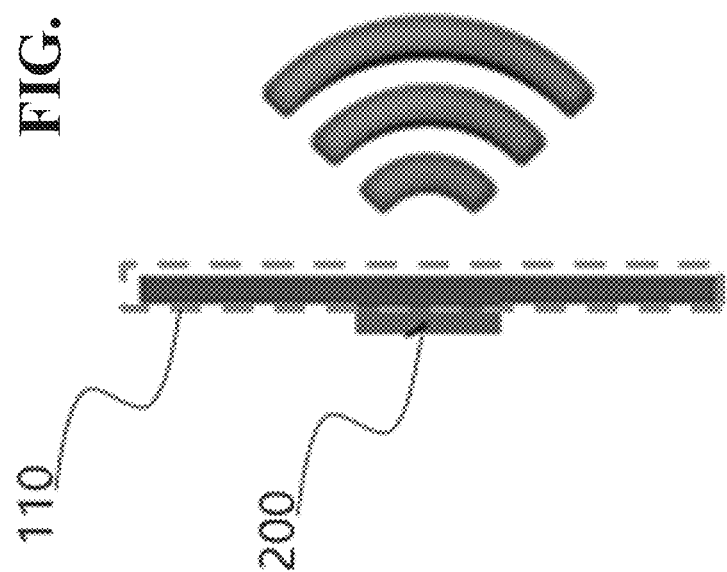
FIGS. 3A and 3B are views each showing an operation principle of a piezoelectric element used in the present disclosure.
Figure 3A:
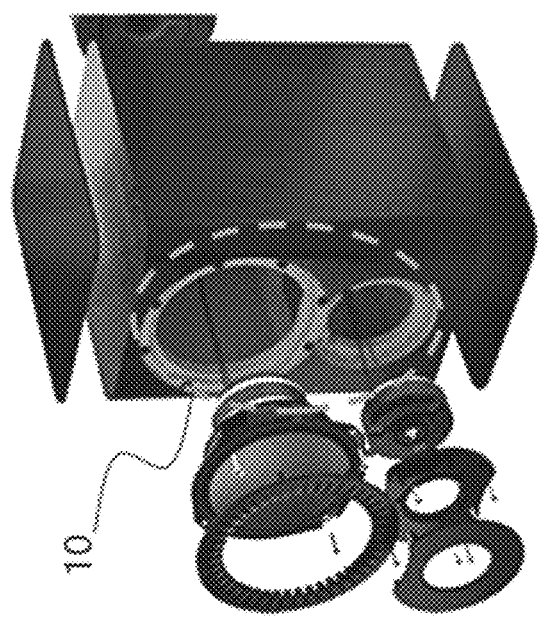

FIGS. 3A and 3B are views each showing an operation principle of a piezoelectric element used in the present disclosure.

First, as shown in FIG. 3A, a general speaker 10 may require an opening for outputting sound.

In detail, when viewing an operation principle of the general speaker, a voice coil may be positioned in the general speaker. When an electric signal is applied to the voice coil, the voice coil may be vibrated left and right to cause a diaphragm to be vibrated.

Meanwhile, a piezoelectric element 200 is an element vibrated by being contracted or expanded as the electric signal is input thereto. Therefore, as shown in FIG. 3B, in the present disclosure, the piezoelectric element 200 may be positioned on a lens 110, and generate the vibration by using the lens 110 itself as the diaphragm.

In detail, when viewing an operation principle of the present disclosure, if the electric signal is applied to the piezoelectric element 200, the piezoelectric element 200 may repeat the contraction and the expansion, and the lens 110, in contact with its surface, may act as the diaphragm to be vibrated.

Figure 4:
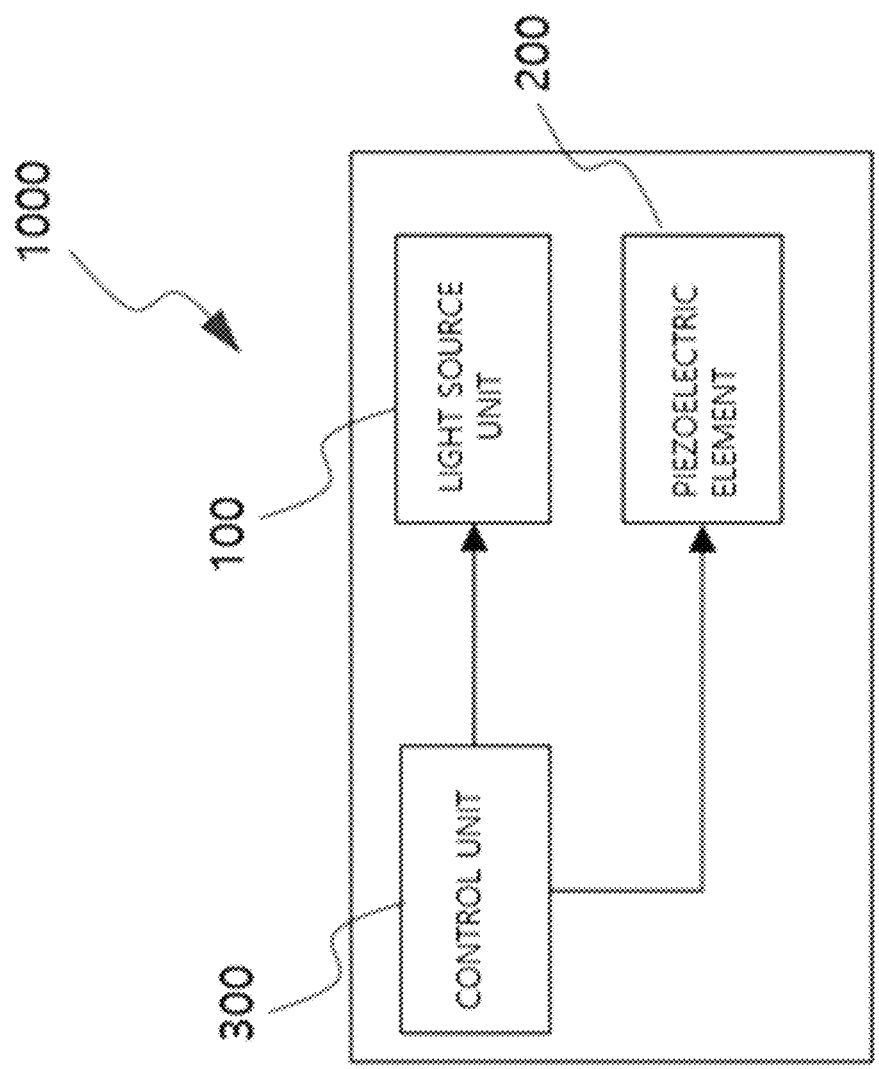
FIG. 4 is a schematic view showing a lamp system for a vehicle according to an embodiment of the present disclosure.

FIG. 4 is a schematic view showing a lamp system for a vehicle according to an embodiment of the present disclosure.

A lamp system 1000 for a vehicle which includes a sensor unit including one of a camera sensor or a distance detection sensor according to an embodiment of the present disclosure may include a light source unit 100, the piezoelectric element 200, and a control unit 300. (The sensor unit may commonly be an advanced driver assistance system (ADAS) sensor, and the sensor unit is hereinafter identified as the ADAS sensor and described in detail.)

Figure 11:
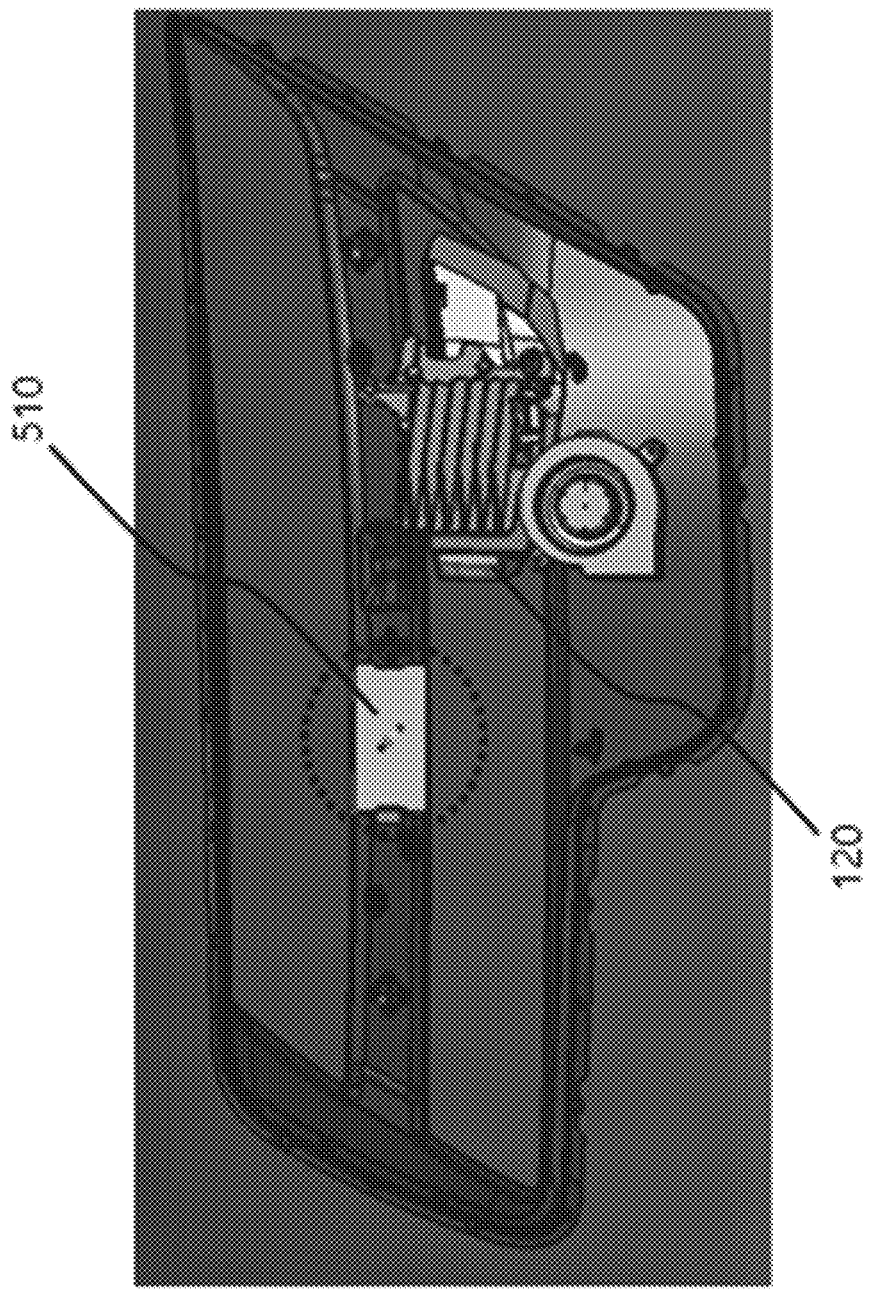
FIG. 11 is a schematic view showing a heat reduction unit according to another embodiment of the present disclosure.

The light source unit 100 may include at least one lens 110 and at least one light source 120 (See FIG. 11).

Here, the lens 110 may refer to an outer lens positioned outside from (or in front of) the light source 120.

The piezoelectric element 200 may be attached to a surface of the outer lens 110 that is directed to the light source, and generate the vibration based on an electrical acoustic signal applied thereto.

The control unit 300 may control the piezoelectric element 200.

In detail, the control unit 300 may control the piezoelectric element 200 by varying the electrical acoustic signal.

Here, the control unit 300 may vary the electrical acoustic signal depending on a situation based on sensing information received from the ADAS sensor.

Figure 5A:
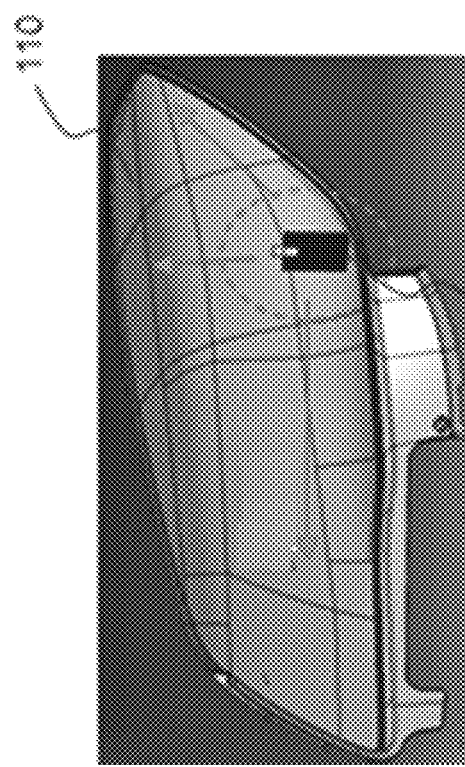
FIGS. 5A, 5B, and 5C are schematic views each showing an operation of the lamp system for a vehicle according to the present disclosure.
Figure 5B:
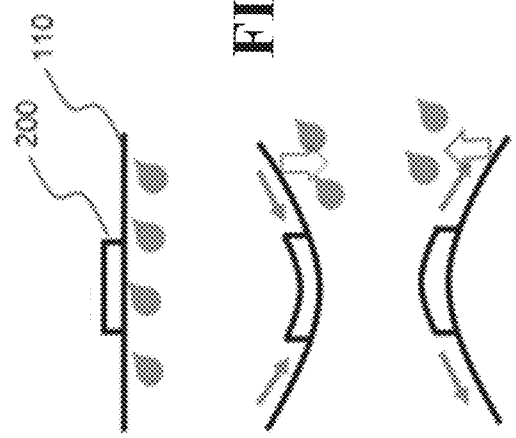
Figure 5C:
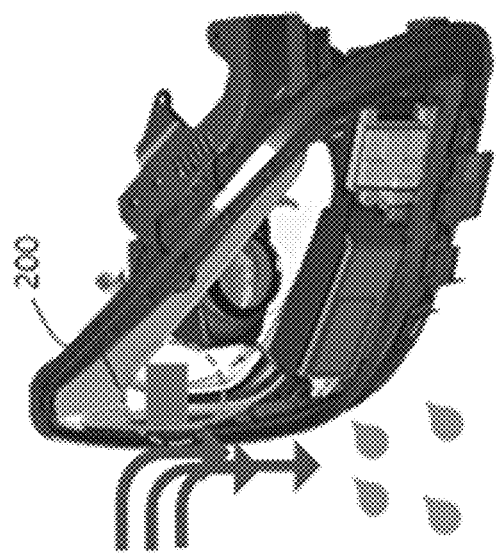

FIGS. 5A, 5B, and 5C are schematic views each showing an operation of the lamp system for a vehicle according to the present disclosure.

As shown in FIG. 5A, the piezoelectric element 200 may be positioned on the surface of the lens 110. In detail, the piezoelectric element 200 may be attached to the surface of the lens 110 that is directed to the light source, and may be attached to its bent corner. In other words, the piezoelectric element 200 and light source are on the same side of the lens 110.

In more detail, the piezoelectric element 200 may be attached to a position where a distance from the center of the lens 110 is closer than a distance from each of the two ends based on a horizontal axis of the surface of the outer lens 110.

This configuration may not interfere with a path of light emitted from the light source 120, and the vibration generated from the piezoelectric element 200 may spread to the entire lens 110 depending on its intensity.

Likewise, referring to FIG. 5A, 5B, or 5C, the vibration may be generated from the lens 110 caused by the vibration generated due to the contraction or expansion of the piezoelectric element 200 positioned on the surface of the lens 110, thereby removing a foreign material positioned on the surface of the lens 110.

Therefore, when the electrical acoustic signal is converted into a signal which may drive the piezoelectric element 200 and applied to the piezoelectric element 200, the piezoelectric element 200 may be repeatedly contracted and expanded in accordance with a voltage applied thereto, thereby removing the foreign material positioned on the surface of the lens 110.

Figure 6A:
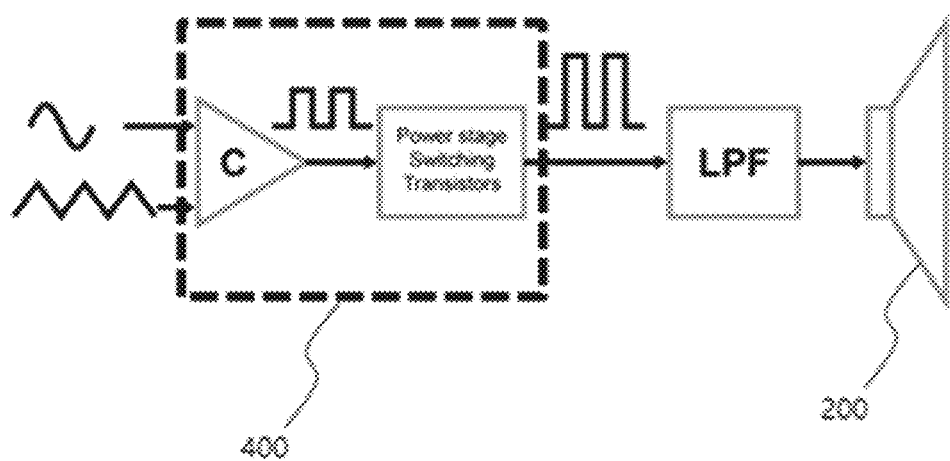
FIGS. 6A and 6B are schematic views each showing a lamp system for a vehicle according to another embodiment of the present disclosure.
Figure 6B:
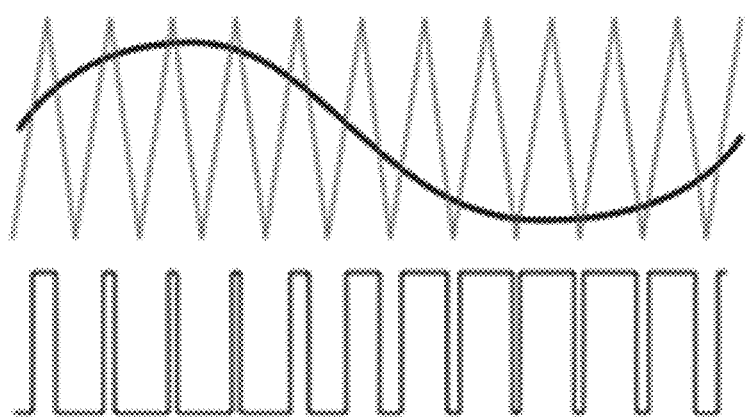

FIGS. 6A and 6B are schematic views each showing a lamp system for a vehicle according to another embodiment of the present disclosure.

As shown in FIGS. 6A and 6B, the lamp system 1000 for a vehicle according to another embodiment of the present disclosure may further include an amplifier 400.

The electrical acoustic signals may be necessary to be amplified to drive the piezoelectric element 200 with the electrical acoustic signal and transmit the vibration to the entire lens 110.

Therefore, the lamp system 1000 may further include the amplifier 400, and the amplifier 400 may receive the electrical acoustic signal and amplify the same to a predetermined standard (output of $40_{p-p}$ or more) or more.

Here, the amplifier 400 may be a class-D amplifier having higher output among audio amplifiers.

The class-D amplifier may be an amplifier amplifying a pulse-width-modulation (PWM) signal, and may convert an analog signal into the PWM signal to amplify the same.

In detail, the class-D amplifier may combine the analog signal with a triangle wave, convert the same into the PWM signal, which is a digital signal, and then amplify the same.

In addition, the class-D amplifier may generate the original analog signal by passing the amplified PWM signal through a low pass filter (LPF), thereby operating the piezoelectric element 200.

Figure 7:
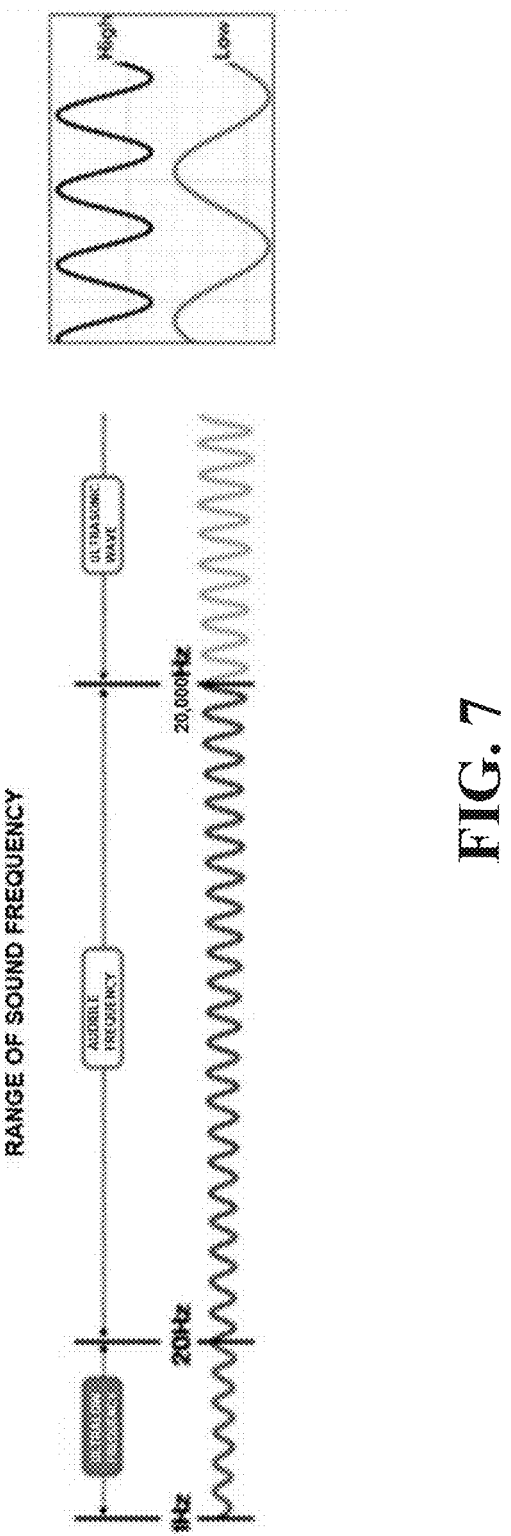
FIG. 7 is a graph showing a range of a sound frequency.

FIG. 7 is a graph showing a range of a sound frequency.

As shown in FIG. 7, it may be seen that, in general, the lower the frequency, the greater a vibration intensity, and the higher the frequency, the weaker the vibration intensity and the more frequent vibration.

In detail, a low frequency refers to a vibration having a lower number of repetitions per second, and may generate a strong vibration rather than rapid amplitude.

On the other hand, a high frequency refers to a vibration having a higher number of repetitions per second compared to the low frequency, and may generate a vibration having a rapid change in amplitude although the vibration intensity is weak.

In addition, an ultrasonic wave refers to a frequency outside an audible frequency range, and may be a vibration having a higher number of repetitions per second than the high frequency.

Therefore, the vibration intensity may be varied based on a frequency of the electrical acoustic signal, and the control unit 300 may thus vary the frequency based on a usage purpose.

In detail, the control unit 300 may perform the vibration at the low frequency (or a first frequency) when determining that the large foreign material is attached to the lens 110 or the foreign material is strongly attached to the lens 110, and perform the vibration at the high frequency (or a second frequency) when determining that it is necessary to remove moisture by performing frequent vibration, such as during rainy weather.

Meanwhile, the low frequency (or the first frequency) may cause loud noise. Therefore, if the foreign material is to be removed while reducing the noise, the control unit 300 may perform the vibration in a range of the ultrasonic wave outside the audible frequency range, which is a higher frequency than a high frequency range (or a third frequency which is higher than the second frequency).

In detail, the control unit 300 may recognize an object positioned in front of the lamp system 1000 for a vehicle based on the sensing information detected through the ADAS sensor to output an acoustic signal at the third frequency, which is the frequency of the ultrasonic range.

In more detail, the control unit 300 may remove the foreign material while preventing the noise by outputting the acoustic signal of the third frequency, which is the frequency of the ultrasonic range when recognizing that a person is positioned in front of the lamp system 1000 for a vehicle based on the sensing information detected through the ADAS sensor.

Figure 8:
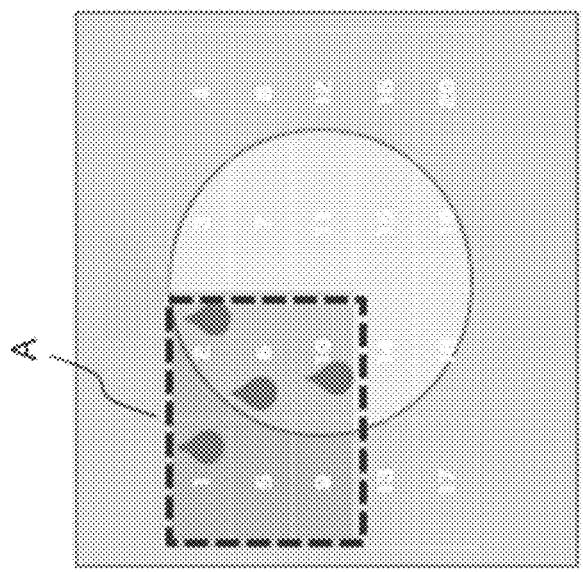
FIG. 8 is a schematic view showing a method for checking for the presence of a foreign material by using a camera sensor.
Figure 8:
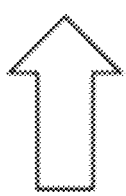
Figure 8:
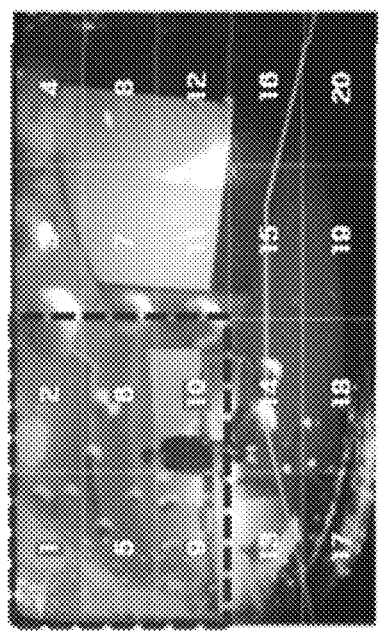
Figure 9:
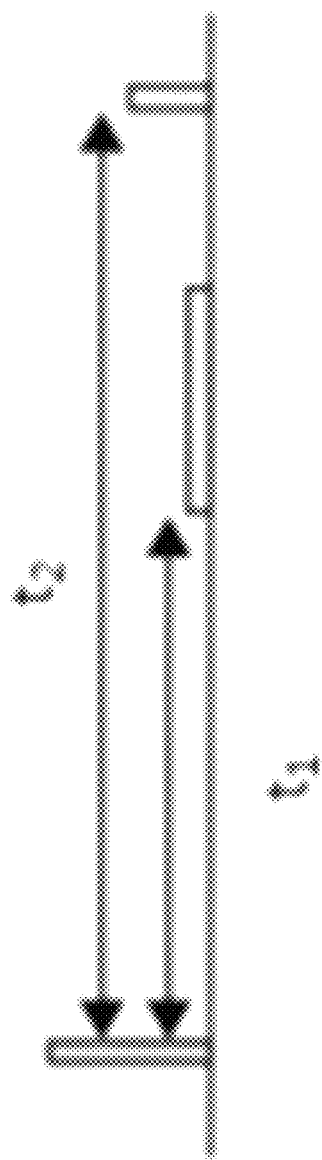
FIG. 9 is a schematic view showing a method for checking for the presence of the foreign material by using a distance detection sensor.

Next, the description describes a foreign material detection method of the control unit 300 in detail with reference to FIG. 8 or 9.

FIG. 8 is a schematic view showing a method for checking for the presence of a foreign material by using a camera sensor.

As shown in FIG. 8, the control unit 300 may obtain image information from the camera sensor, which is one of the ADAS sensors.

In addition, the control unit 300 may determine the presence or absence of the foreign material based on the image information obtained from the camera sensor, and divide the image information into predetermined areas to determine a size of the foreign material based on a distribution area of the foreign material.

The control unit 300 may then vary the frequency of the electrical acoustic signal based on the determined size of the foreign material.

In detail, as described above, the control unit 300 may adjust a vibration amount for the vibration to be stronger by varying the frequency to be the low frequency when the foreign material has a large size, and increase the number of vibrations by varying the frequency to be the high frequency when rainwater continuously flows, such as in rainy weather.

Meanwhile, the control unit 300 may obtain the sensing information from the distance detection sensor as well as the camera sensor.

FIG. 9 is a schematic view showing a method for checking for the presence of the foreign material by using a distance detection sensor.

As shown in FIG. 9, the control unit 300 may receive the sensing information from the distance detection sensor, which is one of the ADAS sensors.

In detail, the distance detection sensor may include a light detection and ranging (LiDAR) sensor, a radar sensor, an ultrasonic sensor, or the like.

In more detail, the LiDAR sensor may measure a distance to the object by using light.

In addition, the radar sensor may measure the distance to the object by using a radio wave.

In addition, the ultrasonic sensor may measure the distance to the object by using the ultrasonic wave.

In addition, the distance detection sensor may measure the distance by transmitting light or a radio wave and measuring its return time.

Based on this configuration, the control unit 300 may determine that an obstacle exists at a close distance when the foreign material exists in the path of light or the radio wave, and determine that the foreign material exists on the surface of lens 110 when determining that the obstacle exists at an unusually close distance.

The control unit 300 may then vary the frequency of the electrical acoustic signal based on the size or type of the foreign material.

In detail, as described above, the control unit 300 may adjust the vibration amount for the vibration to be stronger by varying the frequency to be the low frequency when the foreign material has a large size, and increase the number of vibrations by varying the frequency to be the high frequency when rainwater continuously flows, such as in the rainy weather.

Figure 10:
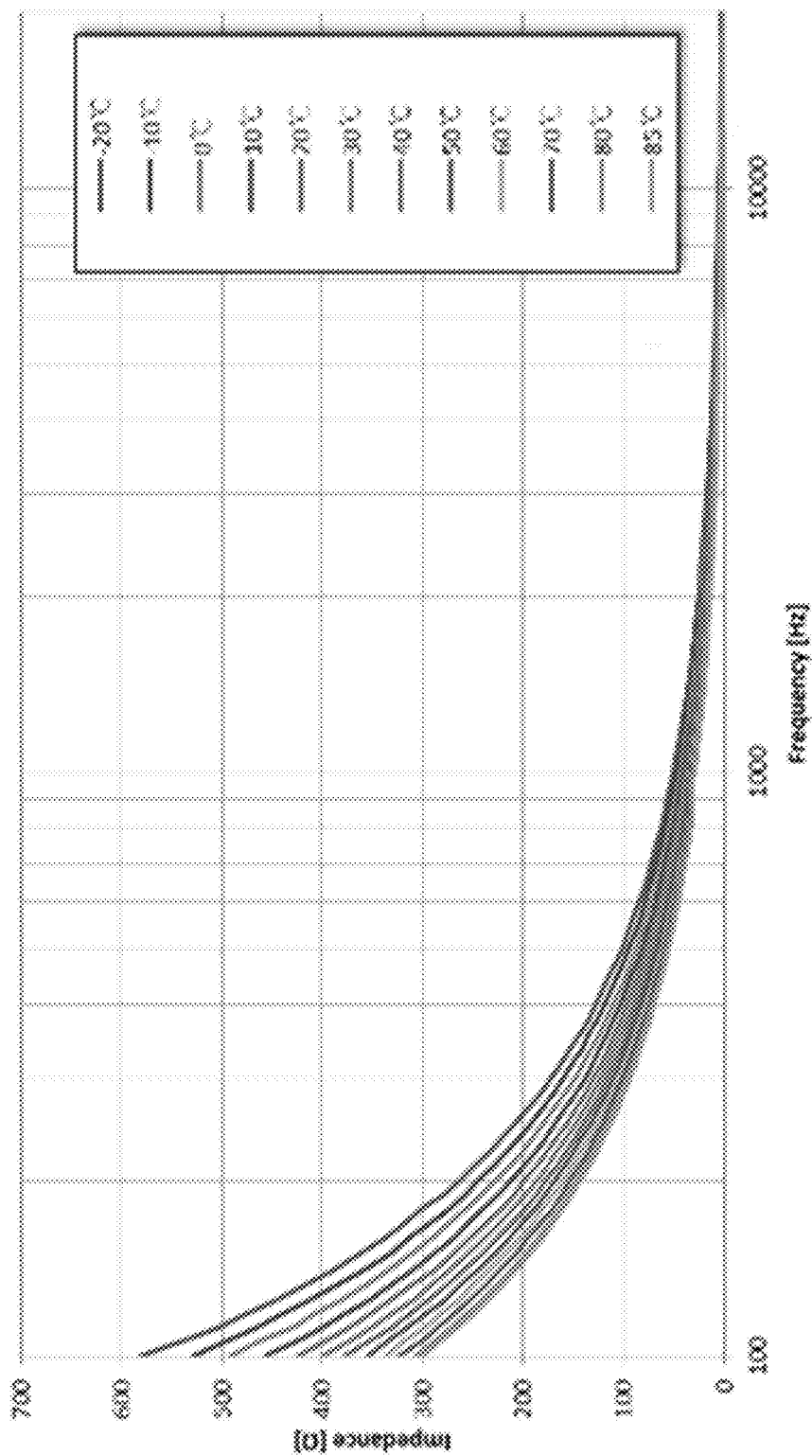
FIG. 10 is a graph showing a change in impedance of the piezoelectric element based on a temperature.

FIG. 10 is a graph showing a change in impedance of the piezoelectric element based on a temperature.

FIG. 11 is a schematic view showing a heat reduction unit according to another embodiment of the present disclosure.

Figure 12A:
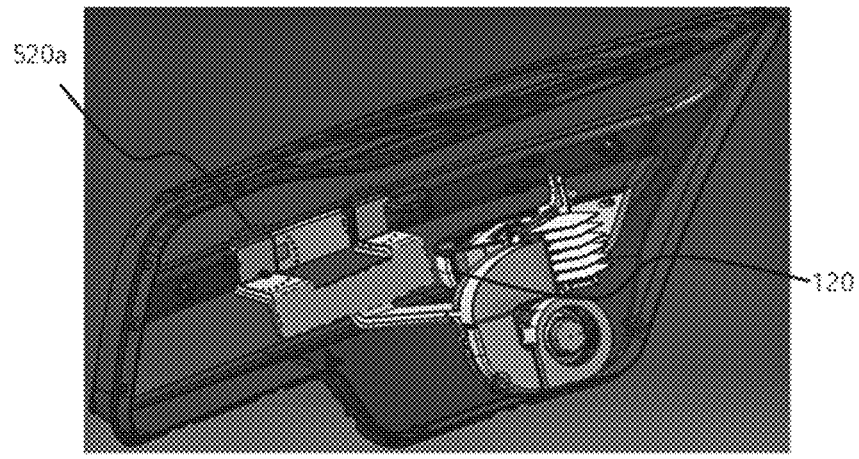
FIGS. 12A and 12B are schematic views each showing a heat reduction unit different from that of FIG. 11.
Figure 12B:
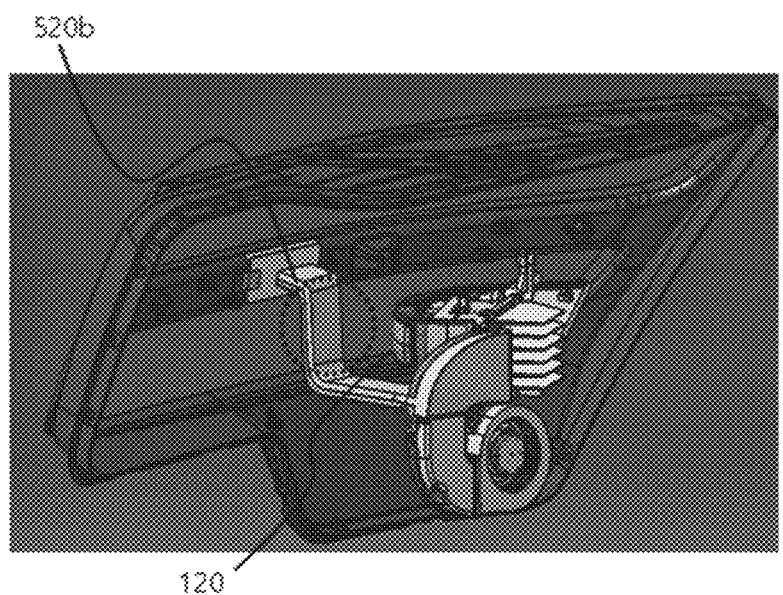

FIGS. 12A and 12B are schematic views each showing a heat reduction unit different from that of FIG. 11.

As shown in FIG. 10, it may be seen that impedance of the piezoelectric element 200 is changed based on a temperature change. A change in the impedance may cause a change in a resonant frequency, and the change in the resonant frequency may change a vibration force of the piezoelectric element 200. Therefore, it is important for the piezoelectric element 200 to maintain a constant temperature.

Accordingly, the lamp system according to another embodiment of the present disclosure may further include a temperature detection sensor (not shown).

The temperature detection sensor may measure the temperature of the piezoelectric element 200, and the control unit 300 may vary the frequency of the electrical acoustic signal based on the measured temperature.

In addition, as shown in FIG. 11 or 12, the lamp system according to another embodiment of the present disclosure may further include a heat reduction unit 500.

The heat reduction unit 500 may refer to a device that may reduce heat occurring in the piezoelectric element 200.

In detail, as shown in FIG. 11, the heat reduction unit 500 may include a protection cover 510.

The protection cover 510 may be coupled with the piezoelectric element 200 to prevent the heat occurrence by blocking direct sunlight from the light source 120, thereby maintaining the temperature of the piezoelectric element 200 at a constant level.

In addition, as shown in FIG. 12A or 12B, the heat reduction unit 500 may include a fan.

In detail, a fan 520a or 520b may be positioned on each of the two sides or one side of the piezoelectric element 200, and through this configuration, the fan 520a or 520b may ventilate and expel air or cool the heat of the piezoelectric element 200, thereby preventing the heat occurrence and maintaining the temperature of the piezoelectric element 200 at the constant level.

Meanwhile, the frequency of the electrical acoustic signal may be varied, and sound in the ultrasonic range may be output to vibrate and wash the lens 110, which may interfere with the surrounding ultrasonic sensor to cause malfunction of the lamp system.

Therefore, it is necessary to prevent the interference with the surrounding ultrasonic sensor.

FIGS. 13A, 13B, and 13C are schematic views each showing a method for preventing the interference with the surrounding ultrasonic sensor.

As shown in FIG. 13A, the control unit 300 may irregularly modulate and output the ultrasonic frequency for the ultrasonic sensor to recognize the electrical acoustic signals in the ultrasonic range as the noise.

In detail, the control unit 300 may output a modulated signal by multiplying a carrier wave by the sound source data signal (corresponding to the original signal in FIG. 13).

In more detail, as shown in FIG. 13B, the control unit 300 may also fix and modulate a frequency of the carrier wave when the sound source data signal is a fixed frequency, and as shown in FIG. 13C, the control unit 300 may vary and modulate the frequency of the carrier wave when the sound source data signal is a variable frequency.

Therefore, a frequency of the modulated signal may be increased in a section where a magnitude of the carrier wave is 1, and the frequency of the modulated signal may be decreased in a section where a magnitude of the carrier wave is zero. As a result, the frequency of the modulated signal may be irregularly output.

As set forth above, the lamp system for a vehicle according to the various embodiments of the present disclosure as described above may improve the recognition rate of the ADAS sensor by performing the washing function of the lens.

Although the embodiments of the present disclosure are described as above, the embodiments disclosed in the present disclosure are provided not to limit the spirit of the present disclosure but to fully describe the present disclosure. Therefore, the spirit of the present disclosure may include not only each disclosed embodiment but also a combination of the disclosed embodiments. Further, the scope of the present disclosure is not limited by these embodiments. In addition, it is apparent to those skilled in the art to which the present disclosure pertains that various variations and modifications could be made without departing from the sprit and scope of the appended claims, and all such appropriate variations and modifications should be considered as falling within the scope of the present disclosure as equivalents.

What is claimed is:

1. A lamp system for a vehicle having a sensor unit that includes at least one of a camera sensor or a distance detection sensor, the lamp system comprising:
    a light source unit comprising at least one lens and at least one light source;
    a piezoelectric element positioned on a surface of the lens for generating a vibration based on an electrical acoustic signal; and
    a control unit programmed for controlling the piezoelectric element by varying the electrical acoustic signal based on sensing information received from the sensor unit;
    wherein the control unit is programmed to:
    determine a size of a foreign material on the lens based on a distribution area of the foreign material when determining that the foreign material exists on the lens based on the sensing information received from a sensor unit, and
    vary a frequency of the electrical acoustic signal based on the determined size of the foreign material.

2. The system of claim 1, wherein the control unit is programmed to:
    output an acoustic signal of a first frequency when determining that the size of the foreign material is larger than a predetermined standard, and
    output an acoustic signal of a second frequency when determining that the size of the foreign material is smaller than the predetermined standard, wherein the second frequency is higher than the first frequency.

3. The system of claim 2, wherein the control unit is programmed to:
    recognize an object positioned in front of the lamp system for a vehicle based on the sensing information detected through the sensor unit, and
    output an acoustic signal of a third frequency when recognizing the object, wherein the third frequency is higher than the second frequency.

4. A lamp system for a vehicle having a sensor unit that includes at least one of a camera sensor or a distance detection sensor, the lamp system comprising:
    a light source unit comprising at least one lens and at least one light source;
    a piezoelectric element positioned on a surface of the lens for generating a vibration based on an electrical acoustic signal;
    a control unit programmed for controlling the piezoelectric element by varying the electrical acoustic signal based on sensing information received from the sensor unit; and
    a temperature detection sensor measuring a temperature of the piezoelectric element,
    wherein the control unit varies a frequency of the electrical acoustic signal based on the measured temperature.

5. The system of claim 4, further comprising a heat reduction unit reducing heat occurring in the piezoelectric element.

6. The system of claim 5, wherein the heat reduction unit includes a protection cover coupled with the piezoelectric element.

7. The system of claim 5, wherein the heat reduction unit includes a fan positioned on one side or on two sides of the piezoelectric element.

8. A lamp system for a vehicle having a sensor unit that includes at least one of a camera sensor or a distance detection sensor, the lamp system comprising:
    a light source unit comprising at least one lens and at least one light source;
    a piezoelectric element positioned on a surface of the lens for generating a vibration based on an electrical acoustic signal; and
    a control unit programmed for controlling the piezoelectric element by varying the electrical acoustic signal based on sensing information received from the sensor unit;
    wherein the control unit is programmed to:
    generate the electrical acoustic signal by multiplying a carrier wave by a sound source data signal,
    fix and modulate a frequency of the carrier wave when the sound source data signal has a fixed frequency, and
    vary and modulate the frequency of the carrier wave when the sound source data signal has a variable frequency.

* * * * *